US009704904B2

United States Patent

Lai et al.

(10) Patent No.: US 9,704,904 B2
(45) Date of Patent: Jul. 11, 2017

(54) DEEP TRENCH ISOLATION STRUCTURES AND METHODS OF FORMING SAME

(71) Applicant: Taiwan Semiconductor Manufacturing Company, Ltd., Hsin-Chu (TW)

(72) Inventors: Chih-Yu Lai, Tainan (TW); Cheng-Hsien Chou, Tainan (TW); Cheng-Yuan Tsai, Chu-Pei (TW); Yen-Ting Chiang, Tainan (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/837,795

(22) Filed: Aug. 27, 2015

(65) Prior Publication Data

US 2017/0062496 A1 Mar. 2, 2017

(51) Int. Cl.
*H01L 27/146* (2006.01)

(52) U.S. Cl.
CPC ...... *H01L 27/1463* (2013.01); *H01L 27/1464* (2013.01); *H01L 27/14618* (2013.01); *H01L 27/14621* (2013.01); *H01L 27/14627* (2013.01); *H01L 27/14632* (2013.01); *H01L 27/14645* (2013.01); *H01L 27/14687* (2013.01); *H01L 27/14698* (2013.01)

(58) Field of Classification Search
None
See application file for complete search history.

(56) References Cited

U.S. PATENT DOCUMENTS

2014/0256153 A1* 9/2014 Grill ................ H01L 21/76283 438/762

* cited by examiner

*Primary Examiner* — Whitney T Moore
(74) *Attorney, Agent, or Firm* — Slater Matsil, LLP

(57) ABSTRACT

An embodiment isolation structure includes a first passivation layer over a bottom surface and extending along sidewalls of a trench in a semiconductor substrate, wherein the first passivation layer includes a first dielectric material. The semiconductor device further includes a passivation oxide layer in the trench on the first passivation layer, wherein the passivation oxide layer includes an oxide of the first dielectric material and has a higher atomic percentage of oxygen than the first passivation layer, The semiconductor device further includes a second passivation layer in the trench on the passivation oxide layer, wherein the second passivation layer also includes the first dielectric material and has a lower atomic percentage of oxygen than the passivation oxide layer.

20 Claims, 16 Drawing Sheets

DEEP TRENCH ISOLATION STRUCTURES AND METHODS OF FORMING SAME

BACKGROUND

Image sensor chips are widely used in applications such as cameras. In the formation of image sensor chips, image sensors (such as photodiode devices) are formed on a silicon substrate of a wafer, followed by the formation of an interconnect structure on a front side of the wafer. After the formation of the interconnect structure, the wafer is thinned, and backside structures such as color filters and micro-lenses are formed on the backside of the wafer. When the image sensor chips are used, light is projected on the image sensors, in which the light is converted into electrical signals. For example, the image sensors in the image sensor chips generate electrical signals in response to the stimulation of photons.

In the image sensor chips, deep trenches are formed in the silicon substrate to separate the image sensors from each other. The deep trenches are filled with dielectric materials, which may include an oxide, to isolate the neighboring devices from each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
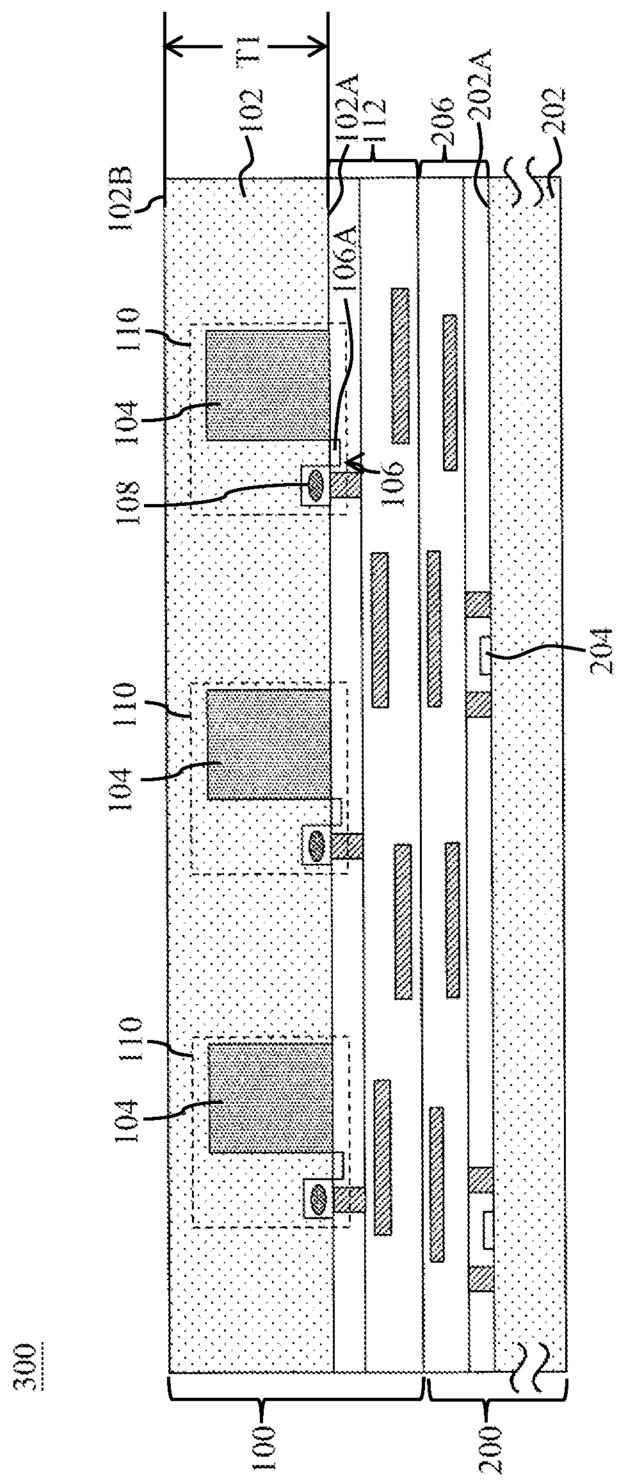
FIGS. 1 through 16 illustrate various intermediary stages of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include an isolation trench disposed between to image sensing elements (e.g., photodiode devices) in a semiconductor substrate. A multi-layered passivation structure is formed within the trench (e.g., extending along sidewalls and over a bottom surface of the trench). The multi-layered passivation structure includes a two or more passivation layers (e.g., comprising a high band gap dielectric material) and passivation oxide layers (e.g., comprising an oxide of the high band gap dielectric layer) disposed between each of the passivation layers. The passivation oxide layer comprises a higher atomic percentage of oxygen than the passivation layers. By including passivation oxide layers, heterology dipoles accumulate at an interface between passivation oxide layers and passivation layers, which increases the amount of fixed charge within the multi-layered passivation structure. Thus, an isolation structure that provides improved electrical function, such as reduced electrical crosstalk, increased signal to noise ratio, reduced white pixel and dark current degradation is provided according to various embodiments. The passivation oxide layer also allows for the formation of a thinner passivation structure, which advantageously improves the optical performance (e.g., quantum efficiency) of the resulting image sensor device.

FIGS. 1 through 14B illustrate various intermediary stages of forming deep trench isolation (DTI) structures in a semiconductor device package according to some embodiments. Referring first to FIG. 1, a cross-sectional view of a semiconductor package 300 is provided. Semiconductor package 300 includes a chip 100 bonded to a chip 200. In an embodiment, chip 100 is a backside illumination (BSI) image sensor device and chip 200 is a logic circuit chip, such as an application specific integrated circuit (ASIC) device. Chip 100 comprises a semiconductor substrate 102, which may be a crystalline silicon substrate or a semiconductor substrate formed of other semiconductor materials. Other substrates, such as a multi-layered or gradient substrate, may also be used. Throughout the description, surface 102A is referred to as a front surface of semiconductor substrate 102, and surface 102B is referred to as a back surface of semiconductor substrate 102, which coincides with a back surface of chip 100. Photodiode devices 104 are formed at a front surface 102A of semiconductor substrate 102, for example, by implanting impurity ions. In some embodiments, the impurity ions may be implanted an epitaxial layer (not illustrated) within substrate 102. Photodiode devices 104 are configured to covert light signals (e.g., photons) to electrical signals, and may be PN junction photo-diodes, PNP photo-transistors, NPN photo-transistors, or the like. For example, photodiode devices 104 may include an n-type implantation region formed within a p-type semiconductor layer (e.g., at least a portion of substrate 102). In such embodiments, the p-type substrate may isolate and reduce electrical cross-talk between adjacent photo-active regions of photodiode devices 104. In an embodiment, multiple photodiode devices 104 extend from surface 102A into substrate 102 and form a photodiode device array, which is illustrated in a top-down view of FIG. 14B.

FIG. 1 also illustrates example Metal-Oxide-Semiconductor (MOS) transistors 106, which are formed at front surface 102A of substrate 102. In some exemplary embodiments, each photodiode device 104 is electrically coupled to a first source/drain region of transfer gate transistor 106, which includes a gate stack 106A (e.g., having a gate electrode formed over a gate dielectric, not separately illustrated). The first source/drain region of transfer gate transistor 106 may be shared by the connecting photodiode device 104. Floating diffusion capacitors 108 are also formed in substrate 102, for example, through implanting into substrate 102 to form a p-n junction, which acts as floating diffusion capacitor 108. Floating diffusion capacitor 108 may be formed in a second source/drain region of transfer gate transistor 106, and hence one of the capacitor plates of floating diffusion capacitor 108 is electrically coupled to the second source/drain region of transfer gate transistor 106. A combination of photodiode devices 104, transfer gate transistors 106, and floating diffusion capacitors 108 form pixel units 110.

An interconnect structure 112 may be formed over the photodiode devices 104 and the substrate 102. Interconnect structure 112 may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), plasma-enhanced CVD (PECVD), or the like. The interconnect structure electrically connects various active devices (e.g., pixel units 110) to form electrical circuits within chip 100. Various input/output (I/O) and/or passivation features (not illustrated) may also be optionally formed over interconnect structure 112 depending on device design.

As shown in FIG. 1, chip 100 is stacked and bonded on top of chip 200 using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding, any combinations thereof and/or the like. Chip 200 includes a semiconductor substrate 202 and electrical circuitry 204 formed at a front surface 202A of substrate 202. Substrate 202 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical circuitry 204 formed on the substrate 202 may be any type of circuitry suitable for a particular application. For example, electrical circuitry 204 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions by interconnect structure 206 of chip 200. Interconnect structure 206 may be substantially similar to interconnect structure 112, and the electrical functions provided by interconnect structure 112 may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

After chip 100 and chip 200 are bonded, a thinning process may be applied to the back surface 102B of chip 100. In an embodiment, the thinning process serves to allow more light to pass through from back surface 102B of substrate 102 to the photo-active regions of photodiode devices 104 without being absorbed by substrate 102. In an embodiment in which photodiode devices 104 are fabricated in an epitaxial layer, back surface 102B of chip 100 may be thinned until the epitaxial layer is exposed. The thinning process may be implemented by using suitable techniques such as grinding, polishing, a SMARTCUT® procedure, an ELTRAN® procedure, and/or chemical etching. After thinning, substrate 102 may have a thickness T1 of about 2 μm, for example, although other embodiments may include substrate 102 having a different thickness after thinning. In some embodiments, during thinning, substrate 202 may act as a support wafer to provide structural support for package 300. Furthermore, although chips 100 and 200 are described as “chips” herein, various stages of manufacture (e.g., bonding, thinning, and the like) may be performed while chips 100 and 200 are parts of larger wafers, which may include other additional chips. In such embodiments, a singulation process may be performed to separate chips 100 and 200 from other features of the wafers at any suitable stage during the manufacturing process.

Figure 2:
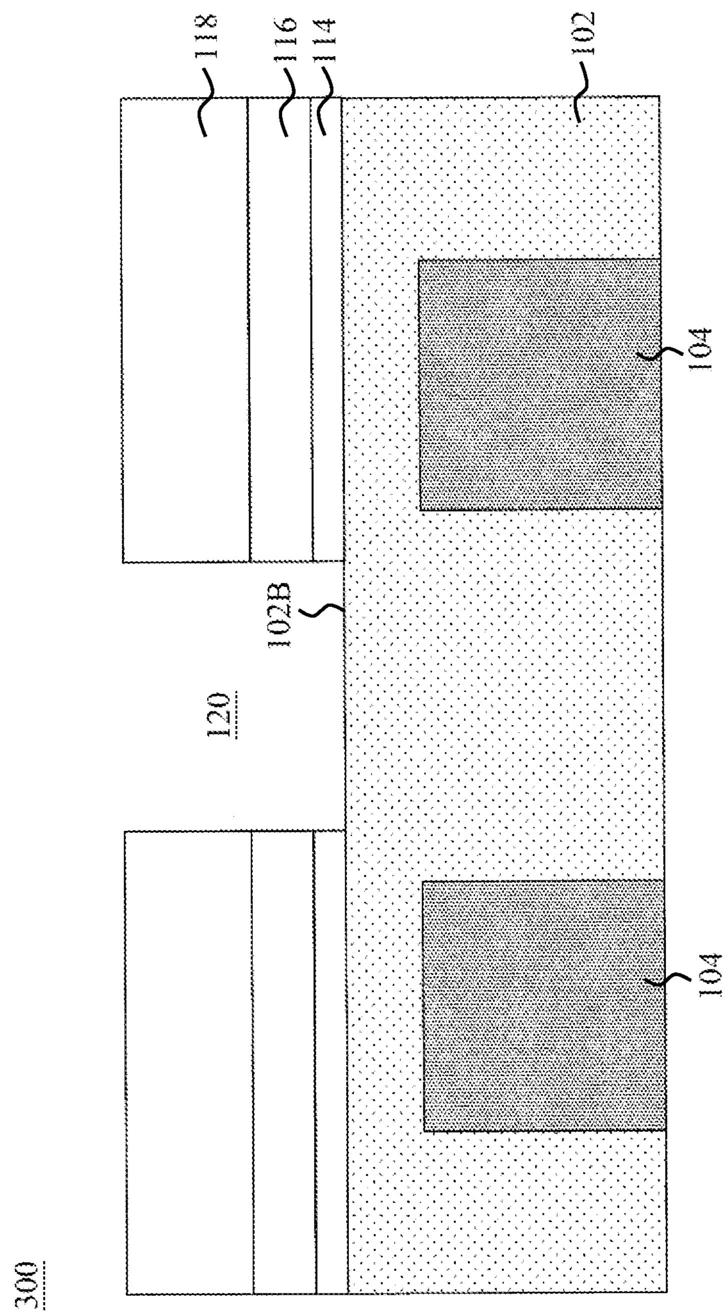

After bonding and thinning, DTI structures 144 (see FIG. 14A) may be formed within substrate 102 between adjacent photodiode devices 104 to improve the signal to noise ratio of chip 100 and reduce electrical crosstalk. FIGS. 2 through 5 illustrate various intermediary stages of patterning a trench in substrate 102 in accordance with some embodiments. Referring first to FIG. 2, a detailed view of semiconductor substrate 102 and photodiode devices 104 within substrate 102 is provided. In FIG. 2, only two photodiode devices 104 are illustrated within substrate 102 while other features within substrate 102 (e.g., other photodiode devices 104, floating diffusion capacitors 108, and the like, see FIG. 1) are omitted for clarity. A mask layer 114, a bottom anti-reflective coating (BARC) layer 116, and a photoresist 118 are formed on a back surface 102B of substrate 102.

Mask layer 114 may comprise one or more oxide (e.g., silicon oxide) and/or nitride (e.g., silicon nitride) layers to portions protect the underlying substrate 102 during patterning. Mask layer 114 may be blanket deposited over substrate 102 using any suitable deposition process, such as, atomic layer deposition (ALD), chemical vapor deposition (CVD), high density plasma CVD (HDP-CVD), physical vapor deposition (PVD), and the like.

After mask layer 114 is formed, BARC layer 116 and photoresist 118 may be blanket deposited over mask layer 114. BARC 116 and photoresist 118 are formed to aid in the patterning of the mask layer 114. For example, BARC 116 helps filter reflection from underlying layers during photolithography, and photoresist 118 may be used to transfer a pattern to mask layer 114. In an embodiment, photoresist 118 may be patterned to include an opening 120 by exposing photoresist 118 to light (e.g., ultraviolet light) using a photomask (not shown). Exposed or unexposed portions of photoresist 118 may then be removed depending on whether a positive or negative resist is used to form an opening 120. Opening 120 may be aligned with an area of substrate 102 disposed between adjacent photodiode devices 104. The pattern of photoresist 118 (e.g., opening 120) is then transferred through BARC 116 to mask layer 114 (e.g., using a suitable etching process). Thus, an opening 120 is patterned in photoresist 118, BARC 116, and mask layer 114. Opening 120 exposes a back surface 102B of the semiconductor substrate 102.

Figure 3:
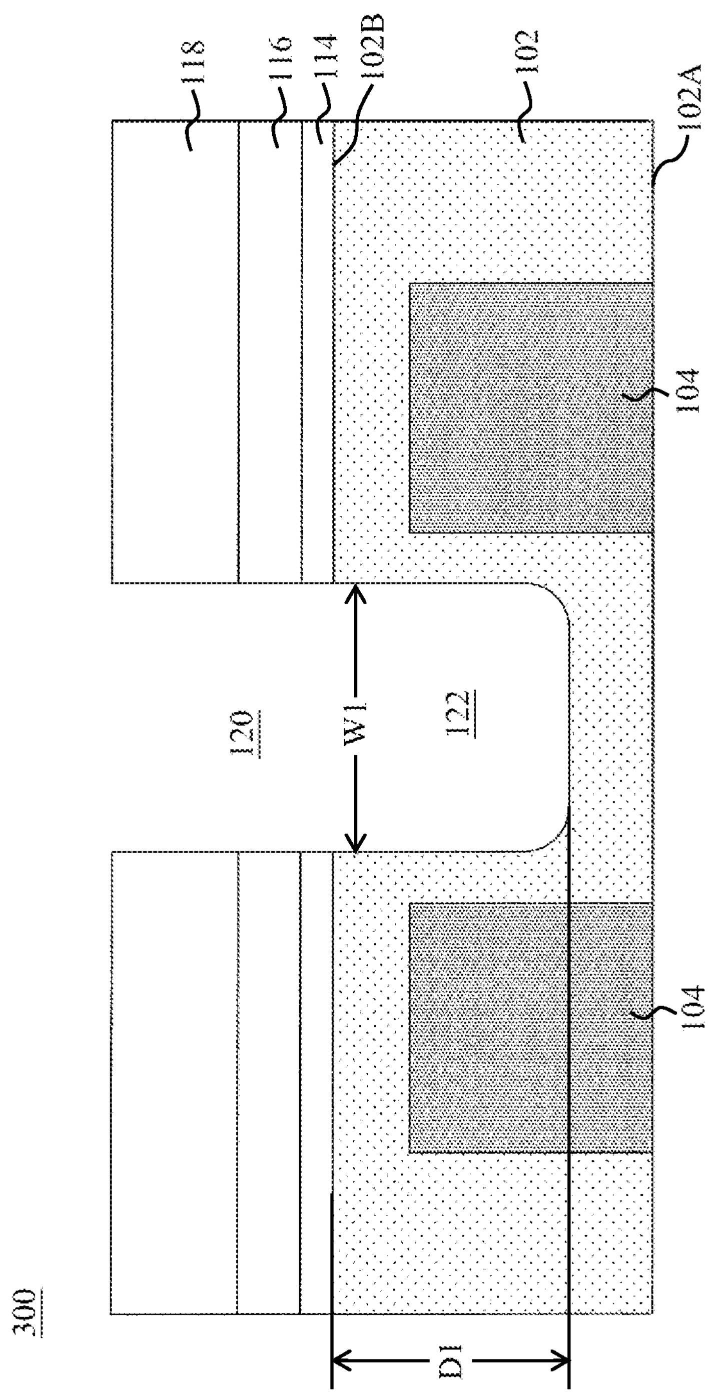

Subsequently, as illustrated in FIG. 3, opening 120 is patterned into the underlying substrate 102 using mask layer 114 as a patterning mask during an etching process to form a trench 122 in substrate 102. The etching of semiconductor substrate 102 may include acceptable etch processes, which may be performed at a relatively low-temperature (e.g., less than about 400° Celsius) to reduce damage to other features (e.g., electrical components, interconnect structures, and the like) within package 300. The etching may be anisotropic, so that the sidewalls of trench 122 are straight, vertical, and substantially perpendicular to surfaces 102A and 102B of substrate 102. Furthermore, there may be process variations, causing trench 122 to be slightly tapered, and hence the sidewalls of trench 122 are substantially perpendicular to (with a slight tilting) surfaces 102A and 102B, for example, with the tilt angle being greater than about 88 degrees, and between about 88 degrees and about 90 degrees. In accordance with some exemplary embodiments, the etching is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The process gases include, for example, fluorine-containing gases (such as $SF_6$, $CF_4$, $CHF_3$, $NF_3$), Chlorine-containing gases (such as $Cl_2$), $Br_2$, HBr, $BCl_3$ and/or the like. In some embodiments, photoresist 118 is consumed during the etching. In another embodiment, remaining portions of photoresist 118 are removed in an ashing and/or wet strip processes, for example.

In the resulting structure, trench 122 extends into substrate 102 and is disposed between adjacent photodiode devices 104. Although only one trench 122 is illustrated, multiple trenches 122 may be patterned in substrate 102, with each trench 122 being disposed between adjacent photodiode devices 104. Trench 122 may extend partially into substrate 102 or fully through substrate 102. For example, in an embodiment, trench 122 may have a bottom surface at an intermediate level between front surface 102A and back surface 102B of semiconductor substrate 102. In another embodiment, trench 122 has a bottom that is substantially level with the front surface 102A of semiconductor substrate 102. In some exemplary embodiments, depth D1 of trench 122 is about 0.5 μm to about 2 μm, and width W1 of trenches 122 greater than about 0.1 μm. It is appreciated, however, that the values recited throughout the description are merely examples, and may be changed to different values. Aspect ratio D1/W1 of trenches 122 may be greater than about 5, for example.

As a result of the etching process, sidewalls of semiconductor substrate 102 within trench 122 may be damaged (e.g., as a result bombardment of etching atoms). The damaged surface layer causes the increase in the dark currents (e.g., current generated by photodiode devices when not exposed to light) of photodiode pixels when the resulting DTI region is used for isolating the photodiode pixels. The damaged surface layer may also cause the increase in white pixels, which are the pixels generating currents when not exposed to light. Accordingly, the surface layer is reduced to repair this damage in a damage removal step, as shown in FIG. 4.

Figure 4:
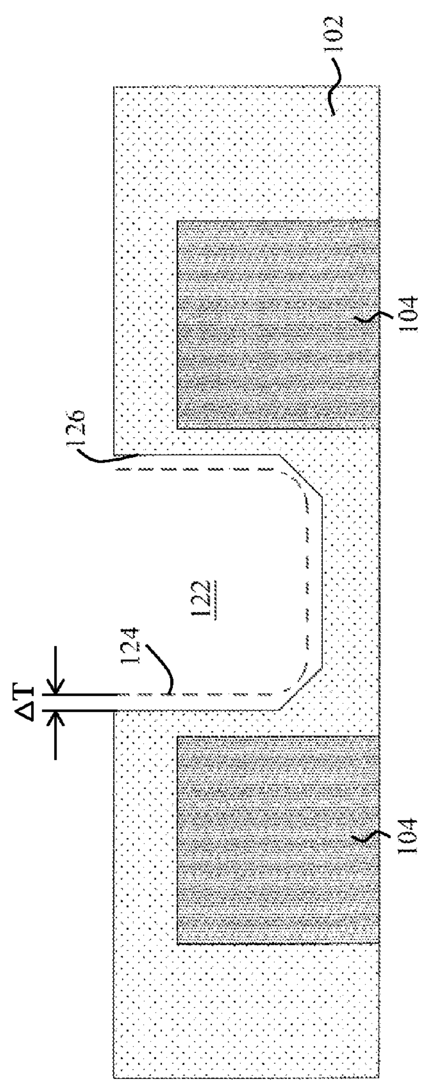

Referring to FIG. 4, a damage removal step is performed to remove the damaged surface layer. In FIG. 4, dashed line 124 represents the position of the surfaces of semiconductor substrate 102 before the damage removal step. The damages in the sidewall surfaces of semiconductor substrate 102 in trench 122 are removed, and the surfaces 126 represent the surfaces of trench 122 after the removal.

The damage removal step may comprise a wet etch, which may be performed using an alkaline-containing (base-containing) solution. In accordance with some embodiments, Tetra-Methyl Ammonium Hydroxide (TMAH) is used in the damage removal step. In accordance with alternative embodiments, the solution of $NH_4OH$, potassium hydroxide (KOH) solution, sodium hydroxide (NaOH), or the like is used to remove the damaged surface layer. The thickness ΔT of the removed surface layer may be greater than about 50 nm, and may be in the range between about 50 nm and about 135 nm. As a result of the damage removal step, a shape of trenches 122 may also be altered as illustrated in FIG. 4.

Figure 5:
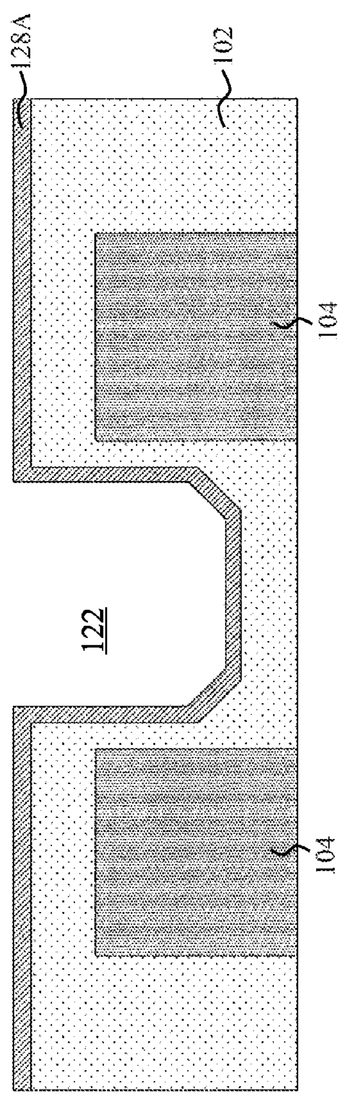
Figure 6:
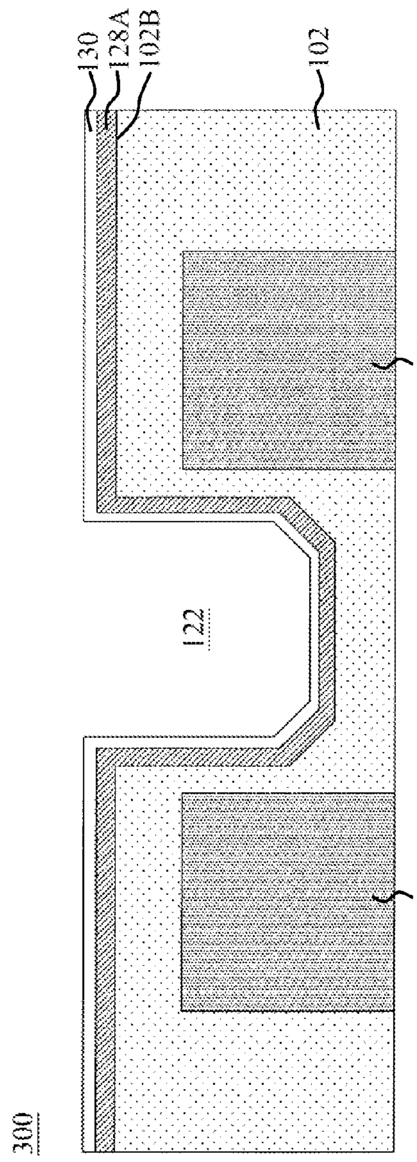
Figure 7:
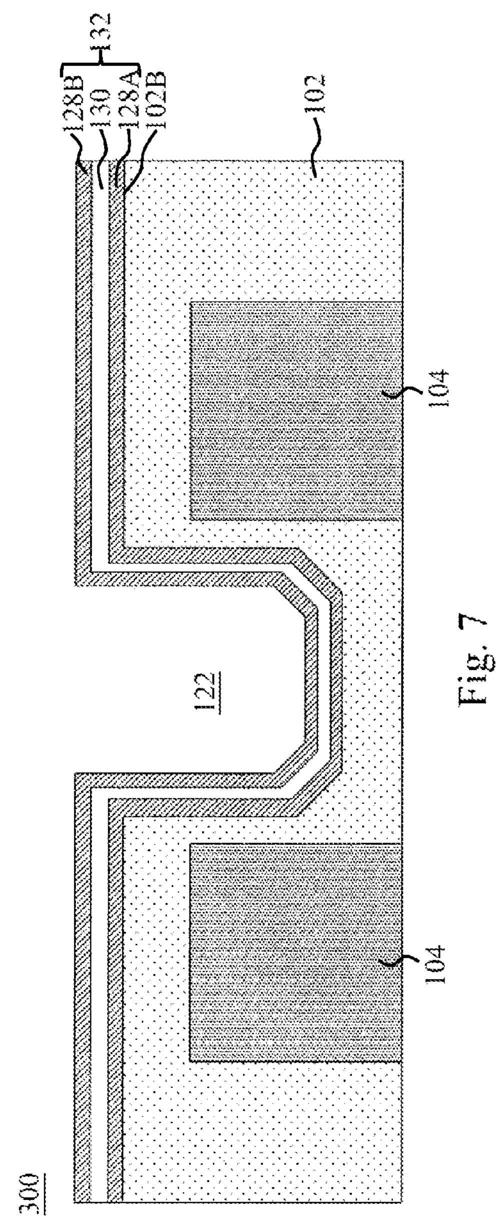

FIGS. 5 through 7 illustrate the formation of a multi-layered passivation structure 132 (see FIG. 7) in trench 122 and over bottom surface 102B of semiconductor substrate 102. Referring first to FIG. 5, a first passivation layer (e.g., high-k dielectric layer 128A) may be formed using a conformal deposition method such as atomic layer deposition (ALD), chemical vapor deposition (CVD), or the like. High-k dielectric layer 128A may extend along sidewalls and over a bottom surface of trench 122. High-k dielectric layer 128A may comprise a relatively high band-gap material for improved electrical isolation. For example, high-k dielectric layer 128A may comprise hafnium oxide ($HfO_2$), aluminum oxide ($Al_2O_3$), magnesium oxide (MgO), calcium oxide (CaO), zirconium oxide ($ZrO_2$), yttrium oxide ($Y_2O_3$), zirconium silicon oxide ($ZrSiO_4$), hafnium silicon oxide ($HfSiO_4$), combinations thereof, or the like. By using a relatively high band-gap material (e.g., about 5.5 eV or greater), high-k dielectric layer 128A induces hole accumulation within trench 122 to provide improved electrical isolation between photodiode devices 104. For example, high-k dielectric layer 128A may reduce electrical crosstalk between photodiode devices 104 and increase the signal to noise ratio of the resulting device. High-k dielectric layer 128A further acts as a passivation layer to further reduce white pixel degradation, which may have occurred as a result of damage to substrate 102 from etching trench 122. In some embodiments, a thickness T1 of high-k dielectric layer 128A may be about 20 Å to about 60 Å although high-k dielectric layer 128A may have other thicknesses in other embodiments.

Although FIG. 5 illustrates high-k dielectric layer 128A as contacting and forming an interface with semiconductor substrate 102, various intermediary layers may be formed between high-k dielectric layer 128A and substrate 102. For example, one or more interfacial oxide layers (e.g., comprising silicon oxide) may be formed on a surface of substrate 102 within trench 122 using a suitable process, such as thermal oxidation, CVD, and the like.

After high-k dielectric layer 128A is firmed, an oxidation process may be performed to form passivation oxide layer 130 on a top surface and sidewalls of high-k dielectric layer 128. Passivation oxide layer 130 may be formed either in-situ (e.g., while an upper portion of high-k dielectric layer 128A is deposited) or ex-situ (e.g., in a separate process after high-k dielectric layer 128A is deposited). The oxidation process may include flowing ozone ($O_3$) and/or oxygen ($O_2$) into trench 122 at a temperature of about 200° C. to about 450° C., for example. The concentration of ozone ($O_3$) or oxygen ($O_2$) flowed into trench 122 may be about 20% or greater in some embodiments. Ozone ($O_3$) and/or oxygen ($O_2$) may be flowed while upper portions of high-k dielectric layer 128A are deposited (e.g., in an in-situ process) or over exposed surfaces of high-k dielectric layer 128A after deposition (e.g., in an ex-situ process). The oxidation process may be applied for a period of about 10 minutes or more to fully form passivation oxide layer 130.

In various embodiments, passivation oxide layer 130 comprises an oxide of the dielectric material of high-k dielectric layer 128A with passivation oxide layer 130 having a higher atomic percentage of oxygen than the material of high-k dielectric layer 128. For example, when high-k dielectric layer 128A comprises $HfO_2$, oxide layer 130 may comprise $Hf_xO_y$ with an atomic percentage of hafnium to an atomic percentage of oxygen being denoted as Y:X. In such embodiments, a ratio Y:X is greater than 2, and an atomic percentage of oxygen in passivation oxide layer 130 is greater than about 66%. Passivation oxide layer 130 may have a thickness of about 10 Å or greater. For example, in an embodiment (e.g., when an ex-situ process is used), passivation oxide layer 130 may have a thickness of about 10 Å or greater while dielectric layer 128A may have a thickness of about 50 Å or greater. In another embodiment (e.g., when an in-situ process is used), a combined thickness of passivation oxide layer 130 and dielectric layer 128A may be about 20 Å or greater. It has been observed that by forming a passivation oxide layer 130 having the above oxygen concentration and thickness, improved signal to noise ratio can be achieved for the resulting device as described in greater detail below.

Subsequently in FIG. 7, a second passivation layer (e.g., high-k dielectric layer 128B) may be formed over passivation oxide layer 130. In some embodiments, the formation of high-k dielectric layer 128B may be part of a continuous deposition process (e.g., ALD, CVD, or the like) used to form high-k dielectric layer 128A. For example, lower portions of high-k dielectric layer 128A is deposited, passivation oxide layer 130 is formed by flowing (or increasing a flow of) ozone ($O_3$) or oxygen ($O_2$) while upper portions of high-k dielectric layer 128A is formed, and then a flow of ozone ($O_3$) or oxygen ($O_2$) is stopped (or decreased) while high-k dielectric layer 128B is formed. In other embodiments, the formation of high-k dielectric layer 128B includes a separate deposition process (e.g., ALD, CVD, or the like) performed after high-k dielectric layer 128A and passivation oxide layer 130 are formed. For example, high-k dielectric layer 128A is deposited using a first deposition process, passivation oxide layer 130 is formed by oxidizing upper portions of high-k dielectric layer 128A after high-k dielectric layer 128A is fully formed, and then high-k dielectric layer 128B is formed using a second deposition process, which is discrete and separate from the first deposition process.

Figure 8B:
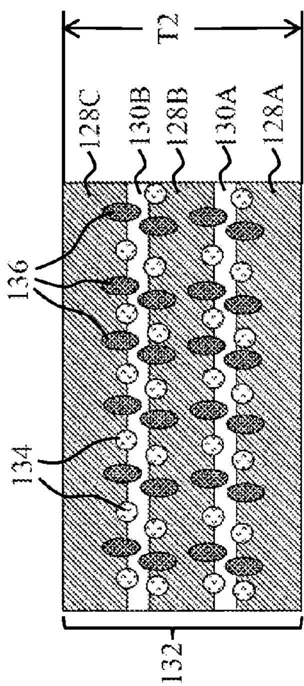
Figure 8A:
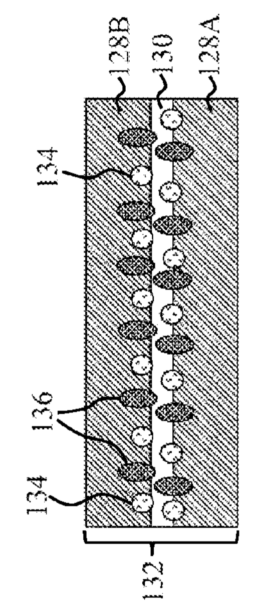

Thus, a multi-layered passivation structure 132 is formed. Detailed views of multi-layered passivation structure 132 according to some embodiments are illustrated in FIGS. 8A and 8B. FIG. 8A illustrates a multi-layered passivation structure 132 having two passivation layers 128A and 128B and a passivation oxide layer 130 disposed therebetween. In other embodiments, any number of passivation layers 128 may be formed having a passivation oxide layers 130 disposed between each consecutive passivation layer 128. For example, FIG. 8B illustrates a multi-layered passivation structure 132 having three passivation layers 128A, 128B, and 128C having passivation oxide layers 130A and 130B disposed between each passivation layer 128A/128B and 128B/128C.

Due to the heterology between passivation layers 128 and passivation oxide layers 130, dipoles 136 may be disposed at interfaces between each passivation layer 128 and passivation oxide layer 130. Dipoles 136 provides increased fixed charges in additional to charges 134 native to passivation layer 128/passivation oxide layer 130. Thus, the hole accumulation of multi-layered passivation structure 132 may be increased to provide for improved electrical isolation, which reduces cross-talk, increases the signal to noise ratio of package 300, and reduces white pixel degradation. Furthermore, by including one or more passivation oxide layers 130 as described above, multi-layered passivation structure 132 may be formed thinner than a passivation without intermediary passivation oxide layers 130 while still providing sufficient number of fixed charges. For example, a total thickness T2 of a three passivation layer structure of FIG. 8B may be about 60 Å, which may generate a total number of fixed charges equal to about $-2166\times10^{-2}/cm^2$ and a feedback voltage of about 0.729V in experiments where passivation oxide layer 130 is formed using an in-situ process. In contrast, a single passivation layer having a thickness of about 60 Å without intermediary passivation oxide layers generates a total number of fixed charges equal to about $-467\times10^{-2}/cm^2$ and a feedback voltage of about 0.714V in the experiments. As another example, a total thickness T2 of a three passivation layer structure of FIG. 8B may be about 180 Å, which may generate a total number of fixed charges equal to about $-1580\times10^{-2}/cm^2$ and a feedback voltage of about 1.114V in experiments where passivation oxide layer 130 is formed using an ex-situ process. In contrast, a single passivation layer having a thickness of about 180 Å without intermediary passivation oxide layers generates a total number of fixed charges equal to about $-1174\times10^{-2}/cm^2$ and a feedback voltage of about 1.056V in the experiments. It has been observed that a thinner multi-layered passivation structure 132 advantageously improves the optical performance (e.g., quantum efficiency) of the resulting optical sensor device.

Figure 9:
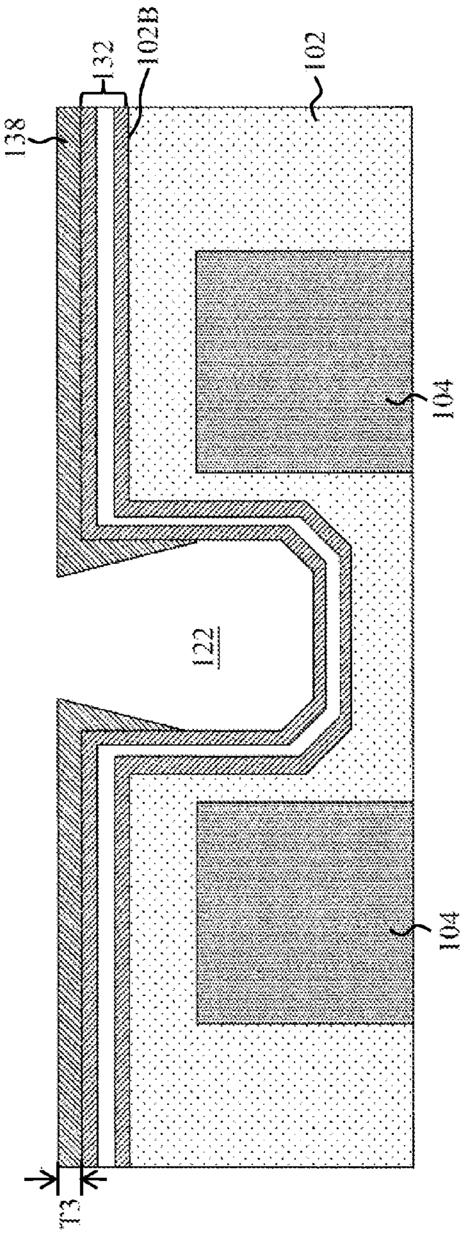

After multi-layered passivation structure 132 is formed, an additional passivation layer (e.g., high-k dielectric layer 138) is formed over multi-layered passivation structure 132 and a back surface 102B of semiconductor substrate 102. High-k dielectric layer 138 may comprise $Ta_2O_5$, and may be formed using a non-conformal deposition method such as physical vapor deposition (PVD). Thus, high-k dielectric layer may only extend partially into trench 122. Thickness T3 of high-k dielectric layer 138 may be in the range between about 300 Å and about 800 Å. Since high-k dielectric layer 138 may be non-conformal, thickness T3 is measured at the horizontal portion of high-k dielectric layer 138 over semiconductor substrate 102. From the top to the bottom of trench 122, the thicknesses of high-k dielectric layer 138 may reduce, as shown in FIG. 9.

Figure 10:
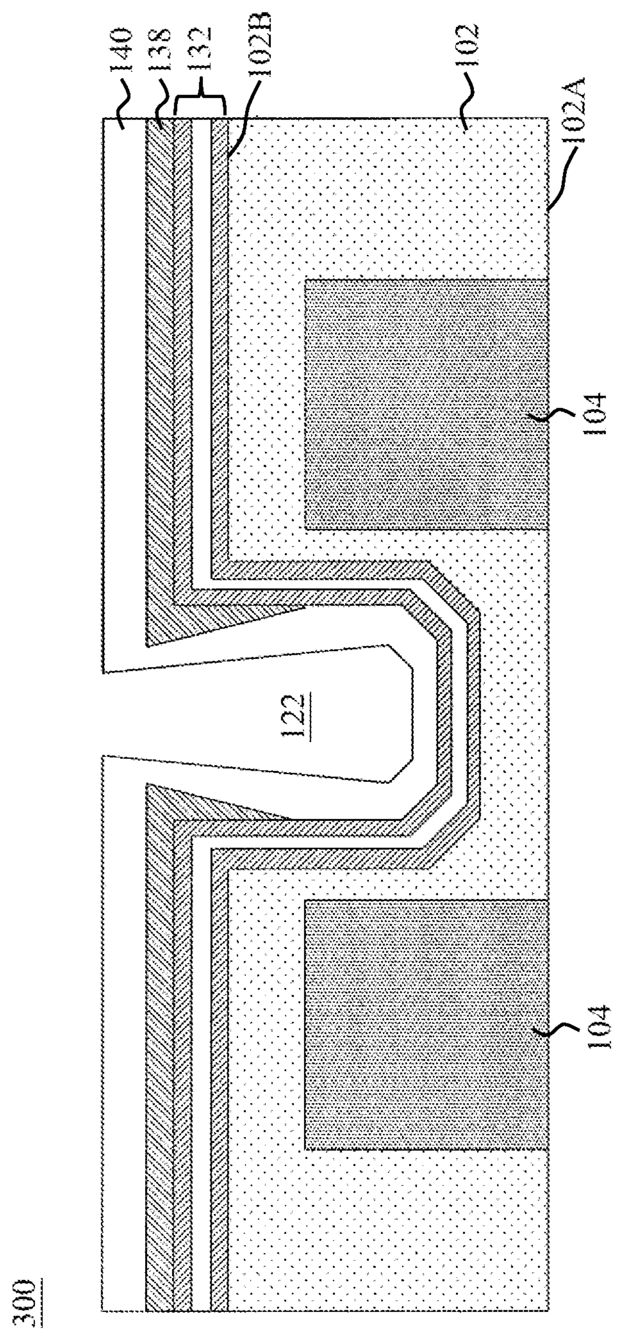

Next, as shown in FIG. 10, dielectric layer 140 is formed over high-k dielectric layer 138 in trench 122. High-k dielectric layer 138 may extend between first portions (e.g., upper portions) of dielectric layer 140 and multi-layered passivation structure 132 in trench 122 while high-k dielectric layer 138 may not extend between second portions (e.g., lower portions) of dielectric layer 140 and multi-layered passivation structure 132 in trench 122. In accordance with some embodiments, dielectric layer 140 comprises an oxide such as silicon oxide, which may be formed using CVD or PECVD in accordance with some embodiments. Dielectric layer 140 is also referred to as buffer oxide layer 140.

Figure 11:
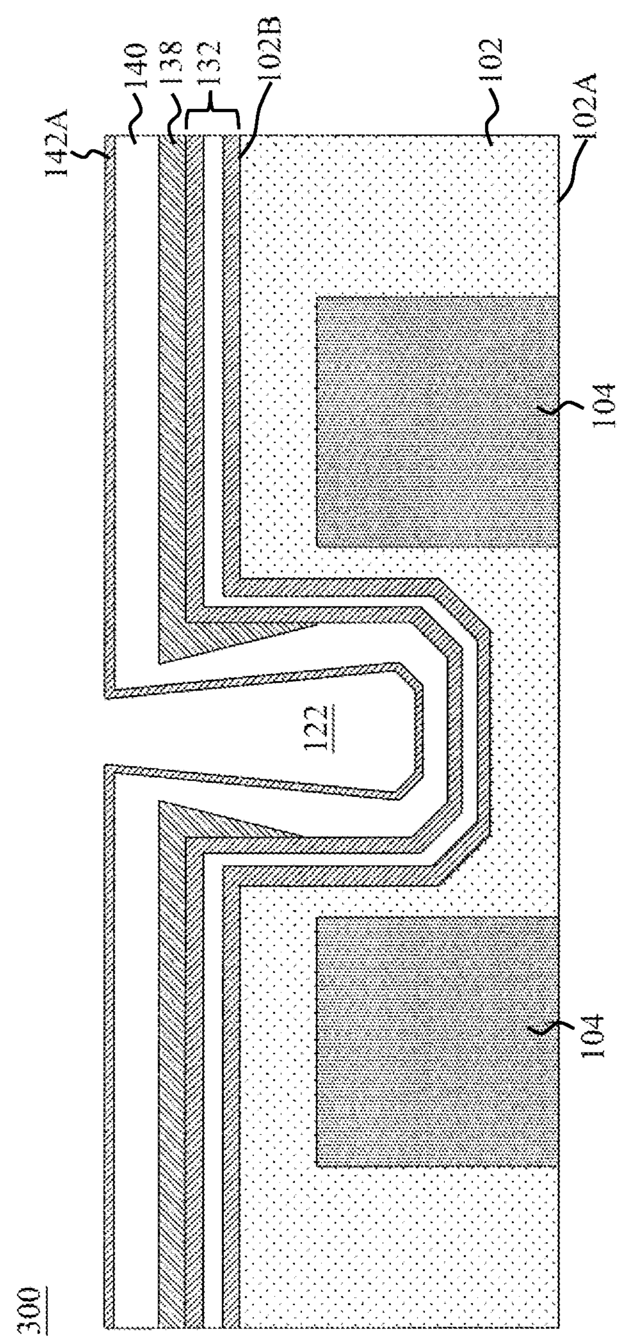
Figure 12:
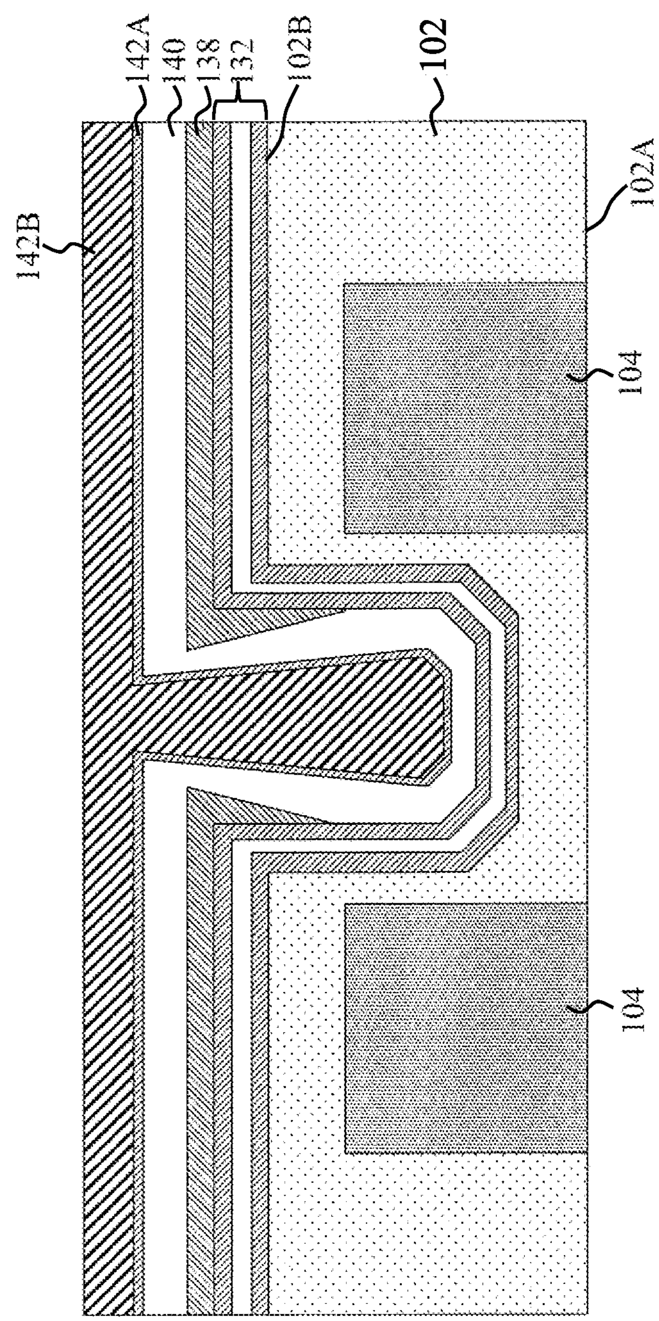
Figure 13A:
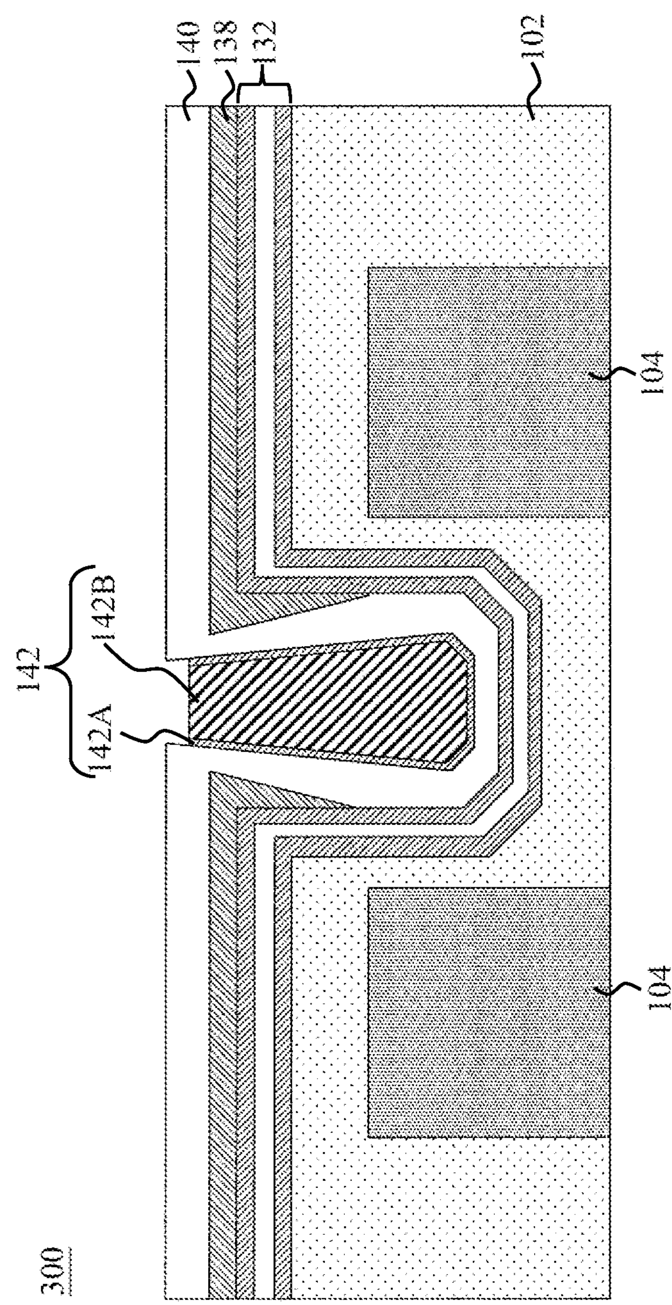
Figure 13B:
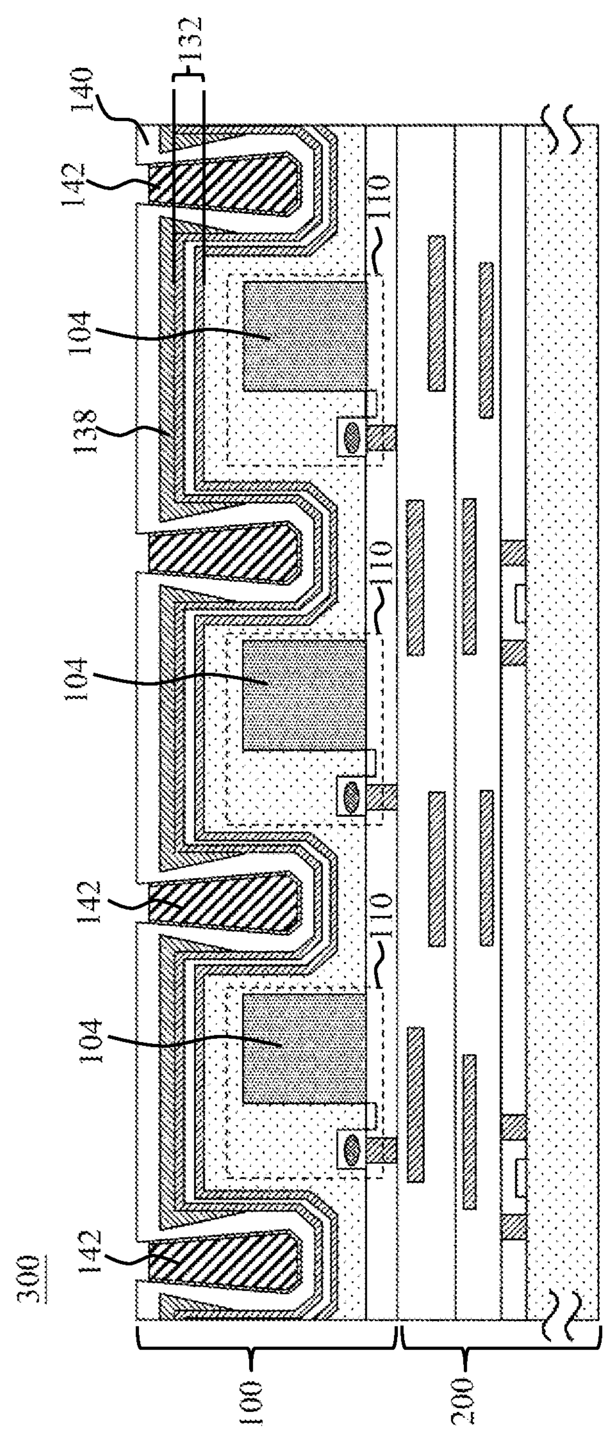

FIG. 11 through 13A illustrates the filling and the etch-back for forming conductive core 142 (see FIG. 13). The formation of conductive core 142 includes a deposition step to form a diffusion barrier layer 142A, which is performed using PVD, Metal-Organic Chemical Vapor Deposition (MOCVD), or the like as illustrated by FIG. 11. Diffusion barrier layer 142A is deposited over top surfaces of dielectric layer 140 in trench 122, and diffusion barrier layer 142A and may comprise titanium nitride, and the like. Next, a conductive layer 142B is deposited over diffusion barrier layer 142A as illustrated by FIG. 12. Conductive layer 142B may include a portion fully filling the remaining portion of trench 122 and additional portions over the horizontal portions of dielectric layer 140. Conductive layer 142B may comprise tungsten in an embodiment although other opaque or reflective (e.g., metallic) materials may be used as well. Next, in FIG. 13A, an etch-back is performed, and the horizontal portions of the diffusion barrier layer 142A/conductive layer 142B outside of trench 122 (FIG. 7) are removed. The remaining portion is shown in FIG. 13A, and is referred to as conductive core 142. The top surface of conductive core 142 may be at any of various positions such as lower than, level with, or higher than, the back surface 102B of semiconductor substrate 102. Conductive core 142 may reduce optical crosstalk and reduce light penetration between adjacent photodiode devices. Dielectric layer 140 and diffusion barrier layer 142A are included to reduce contamination of the material of conductive core 142 (e.g., tungsten) into nearby photodiode devices 104. FIG. 13B illustrates a cross-sectional view of trench 122 disposed between each photodiode device 104 (and pixel unit 110) of package 300 after conductive core 142 is formed. In another embodiment, conductive core 142 may be omitted, and an oxide or air gap may be used to fill remaining portions of trench 122.

Figure 14A:
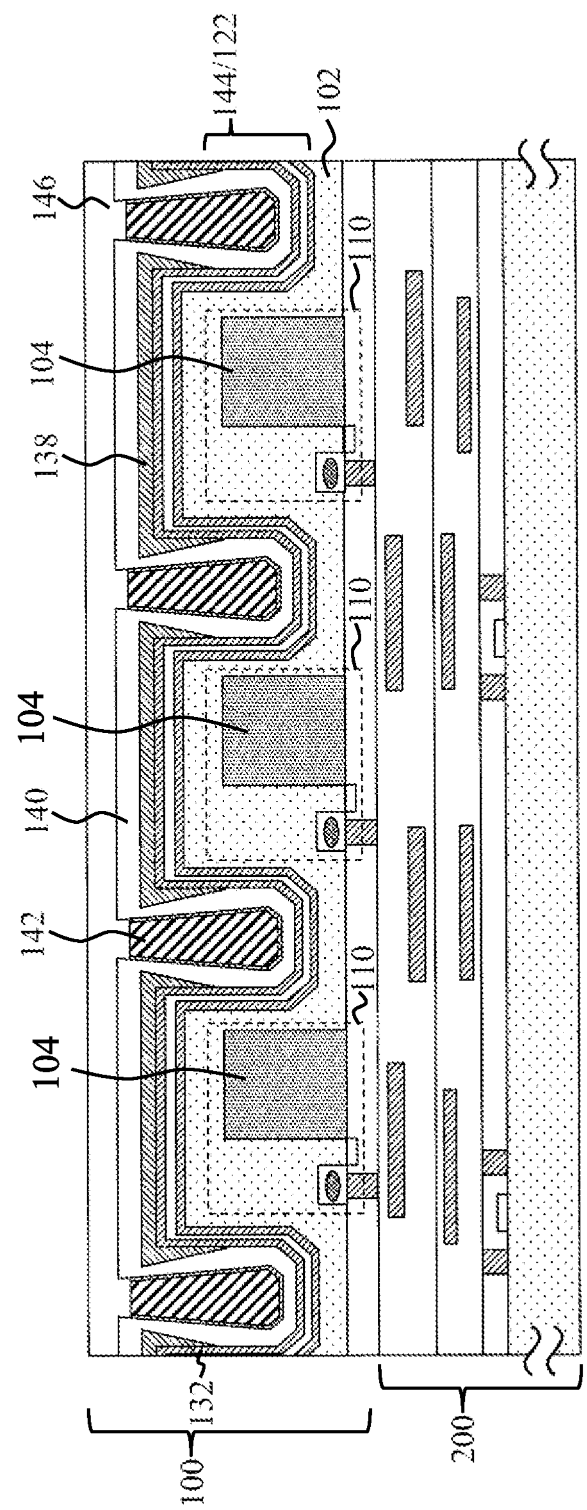

FIG. 14A illustrates the formation of recap dielectric layer 146. The formation process includes a filling step to fill the recess over conductive core 142, wherein a portion of recap dielectric layer 146 is formed over dielectric layer 140. A planarization step is then performed to planarize the top surface of recap dielectric layer 146. In accordance with some embodiments, recap dielectric layer 146 comprises silicon oxide.

Figure 14B:
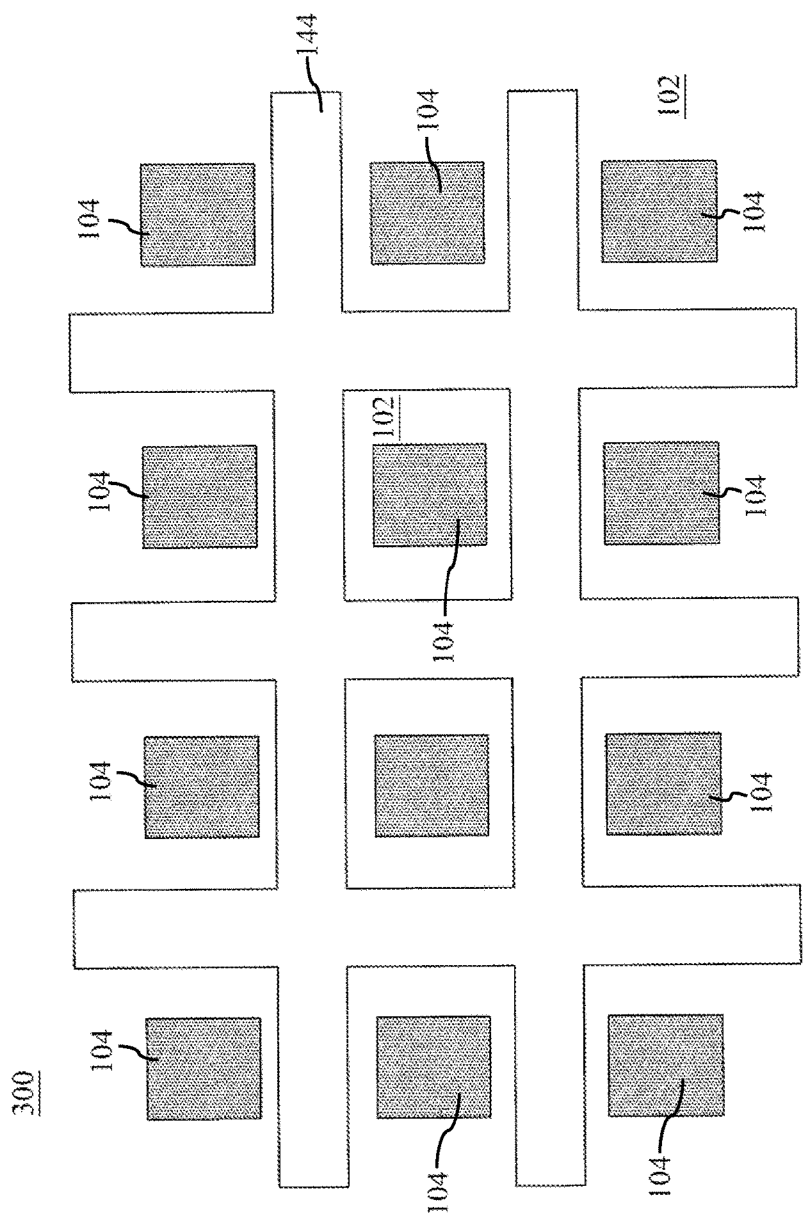

Throughout the description, the portions of the layers in trench 122 are in combination referred to as DTI structure 144. Thus, as illustrated by FIGS. 2 through 14A, a DTI structure 144 is formed disposed at least partially between adjacent photodiode devices 104 in semiconductor substrate 102. FIG. 14B illustrates a corresponding top-down view of DTI structures 144 and photodiode devices 104. As illustrated by FIG. 14B, DTI structures 144 forms a grid and separates each individual photodiode device 104 from adjacent photodiode devices 104 in a pixel array. In accordance with some embodiments, a plurality of DTI structures 144 are formed simultaneously, each having the structure shown in FIG. 13A or 13B. The plurality of DTI structures 144 form a plurality of strips, including a first plurality of strips extending in the X-direction, and a second plurality of strips extending in the Y-direction, which is perpendicular to the X-direction. Hence, the first plurality of strips and the second plurality of strips form a grid pattern, with a plurality of portions of semiconductor substrate 102 (e.g., having a photodiode device 104 disposed therein) separated from each other, and defined by, the grid.

Figure 15:
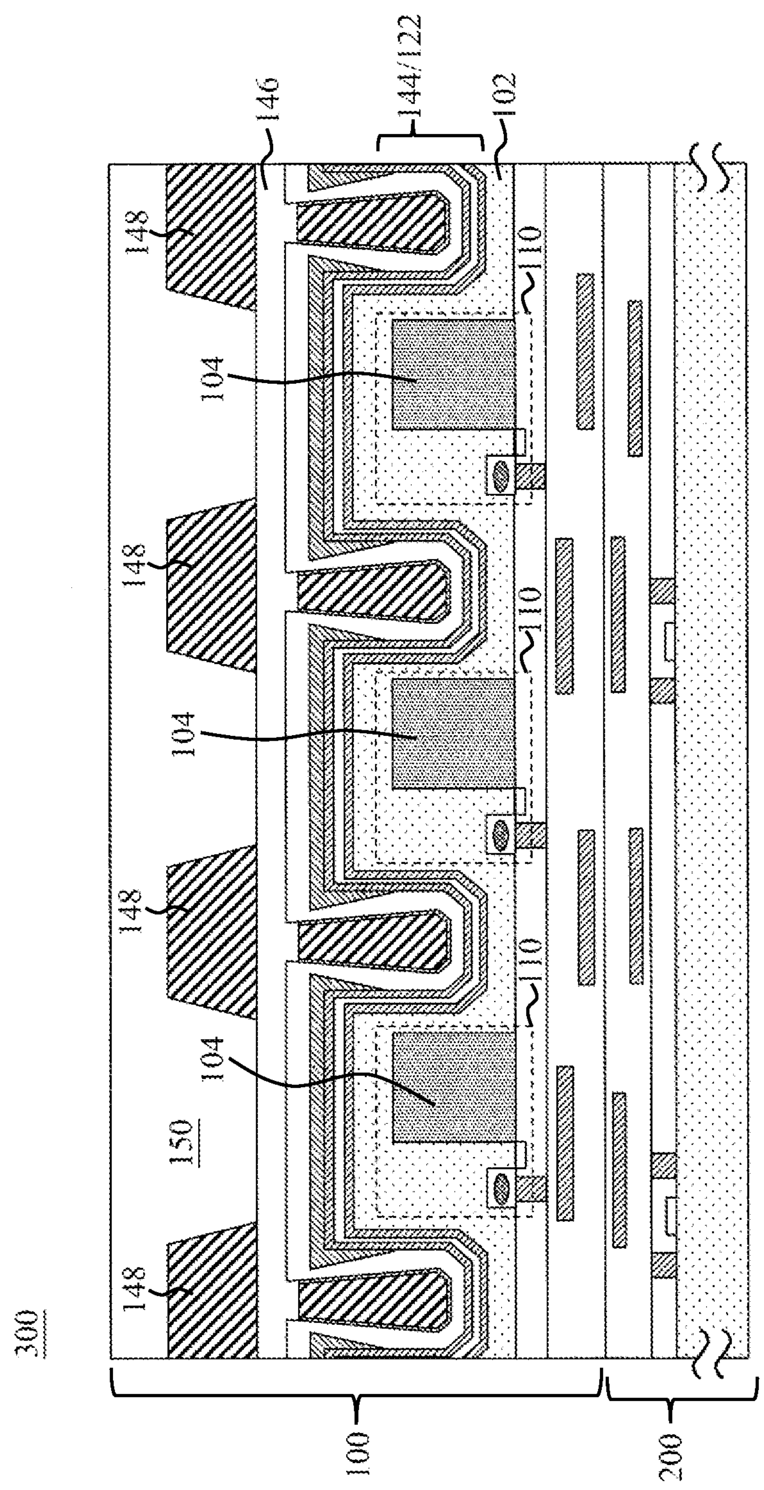
Figure 16:
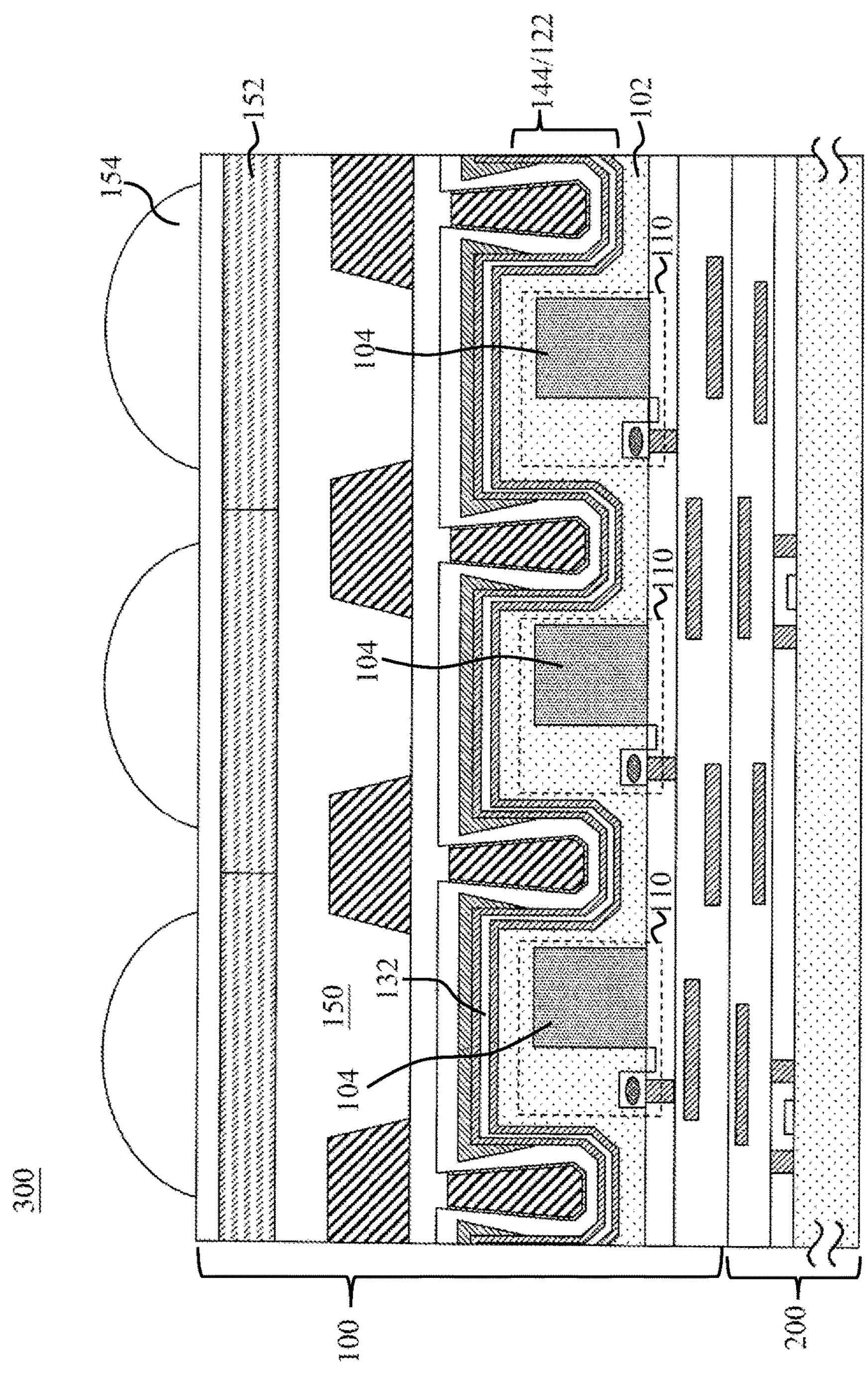

Next, in FIG. 15 a conductive grid 148 is formed over recap dielectric layer 146, and is aligned to corresponding portions of DTI structures 144/trenches 122. Conductive grid 148 may comprise tungsten in an embodiment although other opaque/reflective (e.g., metallic) materials may be used as well. In a top down view, conductive grid 148 may comprise a similar shape as DTI structure 144 as illustrated by FIG. 15B. Conductive grid 148 may reduce optical crosstalk and reduce light penetration between adjacent photodiode devices. Conductive grid 148 may be formed within a dielectric layer 150. A top surface of dielectric layer 150 may extend over conductive grid 148 and be substantially level. Thus, dielectric layer 150 may be planarizing layer used to provide a substantially level surface for forming additional features. Subsequently, in FIG. 16, color filters 152 (e.g., color-pigmented dielectric layers) and micro-lenses 154 are formed over metal grid 148 and dielectric layer 150. Each color filter 152 and micro-lens 154 are aligned to a pixel units 110.

Figure 17:
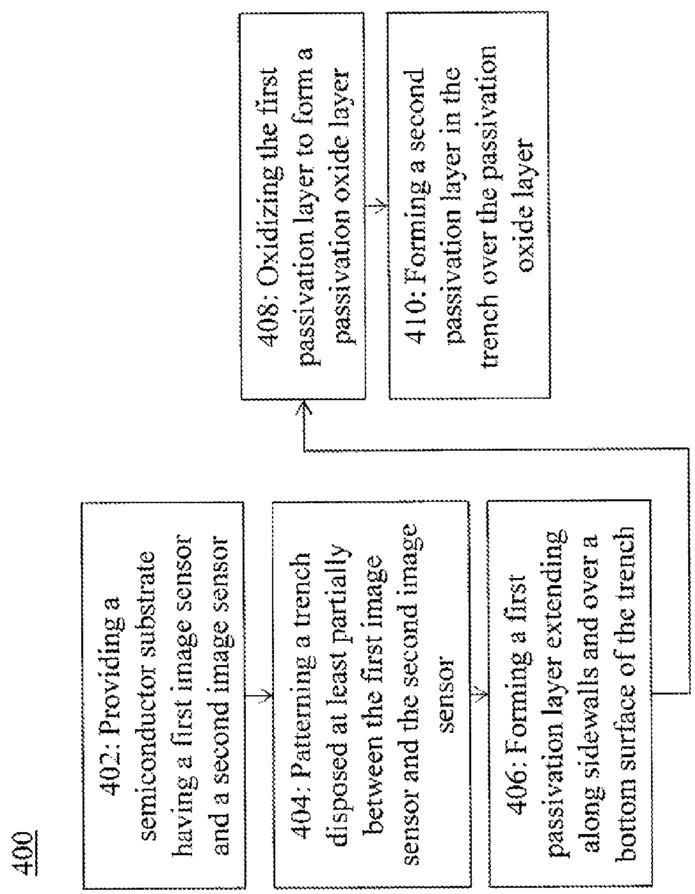
FIG. 17 illustrates a process flow for forming a semiconductor device in accordance with some embodiments.

FIG. 17 illustrates a process flow 400 for forming a semiconductor device according some embodiments. Process flow 400 beings in step 402 where a semiconductor substrate (e.g., substrate 102) having a first photodiode device and second photodiode device (e.g., photodiode devices 104) at a front surface are provided. In step 404, a trench (e.g., trench 122) is patterned extending from a back surface of the semiconductor substrate between the first and the second photodiode devices. The trench may extend through the substrate or stop at an intermediary point between front and back surfaces of the substrate. In step 406, a first passivation layer (e.g., layer 128A) is formed extending along sidewalls and over a bottom surface of the trench. The first passivation layer may comprise a high band gap material (e.g., greater than about 5.5 eV). In step 408, an oxidation process may be performed to oxidize an exposed portion of the first passivation layer in the trench and form a passivation oxide layer (e.g., layer 130) having a higher atomic percentage of oxygen than the first passivation layer. The oxidation process may either be in-situ (e.g., which the upper portions of the first passivation layer is deposited) or ex-situ (e.g., after first the passivation layer is fully formed. In step 410, a second passivation layer (e.g., layer 128B) is formed in trench over the passivation oxide layer. The second passivation layer may comprise a same material as the first passivation layer and have a lower atomic percentage of oxygen than the passivation oxide layer. Additional features, such as additional dielectric and/or conductive layers may be formed within the trench over the second passivation layer to form a DTI isolation structure (structure 144), which electrically isolates the photodiode devices in the substrate.

Various embodiments include an isolation trench disposed between to photodiode devices in a semiconductor substrate. A multi-layered passivation structure is formed within the trench (e.g., extending along sidewalls and over a bottom surface of the trench). The multi-layered passivation structure includes a two or more passivation layers (e.g., comprising a high band gap dielectric material) and passivation oxide layers (e.g., comprising an oxide of the high band gap dielectric layer) disposed between each of the passivation layers. The passivation oxide layer comprises a higher atomic percentage of oxygen than the passivation layers. For example, an atomic percentage of oxygen in the passivation oxide layer may be greater than about 66%. By including passivation oxide layers (e.g., having an atomic percentage as described above), heterology dipoles accumulate at an interface between passivation oxide layers and passivation layers, which increases the amount of fixed charge within the multi-layered passivation structure. Thus, an isolation structure that provides improved electrical function, such as reduced electrical crosstalk, increased signal to noise ratio, reduced white pixel and dark current degradation is provided according to various embodiments. The passivation oxide layer also allows for the formation of a thinner passivation structure, which advantageously improves the optical performance (e.g., quantum efficiency) of the resulting photodiode device.

In accordance with an embodiment, a semiconductor device includes a first passivation layer over a bottom surface and extending along sidewalls of a trench in a semiconductor substrate, wherein the first passivation layer includes a first dielectric material. The semiconductor device further includes a passivation oxide layer in the trench on the first passivation layer, wherein the passivation oxide layer includes an oxide of the first dielectric material and has a higher atomic percentage of oxygen than the first passivation layer. The semiconductor device further includes a second passivation layer in the trench on the passivation oxide layer, wherein the second passivation layer also includes the first dielectric material and has a lower atomic percentage of oxygen than the passivation oxide layer.

In accordance with another embodiment, a semiconductor device includes a first photodiode device and a second photodiode device disposed at a front surface of a semiconductor substrate. The semiconductor device further includes a trench at least partially disposed between the first photodiode device and the second photodiode device and a multi-layered passivation structure extending over a bottom surface and along sidewalls of the trench. The trench extends from a back surface of the semiconductor substrate opposing the front surface of the semiconductor substrate. The multi-layered passivation structure includes a plurality of passivation layers each including a dielectric material having a band-gap greater than about 5.5 electron volts (eV) and one or more oxide passivation layers disposed between each of the plurality of passivation layers. The one or more oxide passivation layers includes an oxide of the dielectric material and includes a higher atomic percentage of oxygen than the plurality of passivation layers.

In accordance with yet another embodiment, a method for forming a semiconductor device includes providing a substrate having a first photodiode device and a second photodiode device and patterning a trench in a semiconductor substrate. The trench is at least partially disposed between the first photodiode device and the second photodiode device. The method further includes forming a first passivation layer over a bottom surface and extending along sidewalls of the trench, oxidizing an upper portion of the first passivation layer to form a passivation oxide layer, and forming a second passivation layer in the trench over the passivation oxide layer. The first passivation layer and the second passivation layer both include a same dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a first passivation layer over a bottom surface and extending along sidewalls of a trench in a semiconductor substrate, wherein the first passivation layer comprises a first dielectric material, and wherein the first dielectric material is an oxide;

a passivation oxide layer in the trench on the first passivation layer, wherein the passivation oxide layer comprises an oxide of the first dielectric material and has a higher atomic percentage of oxygen than the first passivation layer; and a second passivation layer in the trench on the passivation oxide layer, wherein the second passivation layer comprises the first dielectric material and has a lower atomic percentage of oxygen than the passivation oxide layer.

2. The semiconductor device of claim 1, wherein the first passivation layer has a band gap of about 5.5 electron volts (eV) or greater.

3. The semiconductor device of claim 1, wherein an atomic percentage of oxygen of the passivation oxide layer is greater than about sixty-six percent.

4. The semiconductor device of claim 1, wherein the first dielectric material is hafnium oxide ($HfO_2$), aluminum oxide ($Al_2O_3$), magnesium oxide (MgO), calcium oxide (CaO), zirconium oxide ($ZrO_2$), yttrium oxide ($Y_2O_3$), zirconium silicon oxide ($ZrSiO_4$), hafnium silicon oxide ($HfSiO_4$), or a combination thereof.

5. The semiconductor device of claim 1, wherein the trench is at least partially disposed between a first photodiode device and a second photodiode device.

6. The semiconductor device of claim 1 further comprising:

a third passivation layer over the second passivation layer and extending partially into the trench, wherein the third passivation layer comprises a second dielectric material different than the first dielectric material;

an oxide layer extending in the trench over the third passivation layer, wherein the third passivation layer is disposed between a first portion the oxide layer and a first portion the second passivation layer in the trench;

a diffusion barrier layer in the trench over the oxide layer; and a conductive layer in the trench over the diffusion barrier layer.

7. The semiconductor device of claim 6, wherein the third passivation layer is a non-conformal layer and does not extend between a second portion of the oxide layer and a second portion of the second passivation layer in the trench.

8. A semiconductor device comprising:

a first photodiode device and a second photodiode device disposed at a front surface of a semiconductor substrate;

a trench at least partially disposed between the first photodiode device and the second photodiode device, wherein the trench extends from a back surface of the semiconductor substrate opposing the front surface of the semiconductor substrate;

a multi-layered passivation structure extending over a bottom surface and along sidewalls of the trench, wherein the multi-layered passivation structure comprises:

a plurality of passivation layers each comprising a dielectric material having a band-gap greater than about 5.5 electron volts (eV); and one or more oxide passivation layers disposed between each of the plurality of passivation layers, wherein the one or more oxide passivation layers comprises an oxide of the dielectric material and comprises a higher atomic percentage of oxygen than the plurality of passivation layers.

9. The semiconductor device of claim 8, the dielectric material is hafnium oxide ($HfO_2$), aluminum oxide ($Al_2O_3$), magnesium oxide (MgO), calcium oxide (CaO), zirconium oxide ($ZrO_2$), yttrium oxide ($Y_2O_3$), zirconium silicon oxide ($ZrSiO_4$), hafnium silicon oxide ($HfSiO_4$), or a combination thereof.

10. The semiconductor device of claim 8, wherein the trench extends through the semiconductor substrate.

11. The semiconductor device of claim 8, wherein the bottom surface of the trench is disposed at an intermediary point between the front surface and the back surface of the semiconductor substrate.

12. The semiconductor device of claim 8 further comprising:

a non-conformal passivation layer over the multi-layered passivation structure and extending partially into the trench;

a first dielectric layer extending in the trench over the non-conformal passivation layer, wherein the non-conformal passivation layer is partially disposed the first dielectric layer and the multi-layered passivation structure in the trench; and a conductive core in the trench over the first dielectric layer.

13. The semiconductor device of claim 8 further comprising:

a second dielectric layer over the bottom surface of the semiconductor substrate, wherein the multi-layered passivation structure is disposed between the second dielectric layer and the semiconductor substrate;

a third dielectric layer over the second dielectric layer; and a conductive grid in the third dielectric layer and aligned with the trench, wherein the third dielectric layer extends over a top surface of the conductive grid.

14. The semiconductor device of claim 8 further comprising:

a color filter over the bottom surface of the semiconductor substrate, wherein the multi-layered passivation structure is disposed between the color filter and the semiconductor substrate; and a micro-lens over the color filter, wherein the color filter is disposed between the micro-lens and the semiconductor substrate.

15. A device comprising:

a semiconductor substrate comprising a first pixel region and a second pixel region; and an isolation structure disposed at least partially between the first pixel region and the second pixel region, wherein the isolation structure comprises:

a conductive core;

a buffer layer extending along sidewalls and under a bottom surface of the conductive core;

a first dielectric liner extending along sidewalls and under a bottom surface of the buffer layer, wherein the first dielectric liner comprises a dielectric material;

an oxide liner extending along sidewalls and under a bottom surface of the first dielectric liner, wherein the oxide liner comprises an oxide of the dielectric material; and a second dielectric liner extending along sidewalls and under a bottom surface of the first dielectric liner, wherein the second dielectric liner comprises a same dielectric material as the first dielectric liner, and wherein the oxide liner comprises a higher atomic percentage of oxygen than the first dielectric liner and the second dielectric liner.

16. The device of claim 15, wherein the dielectric material has a band-gap greater than about 5.5 electron volts (eV).

17. The device of claim 15, wherein the isolation structure further comprises a high-k dielectric layer disposed between the buffer layer and the first dielectric liner, wherein the high-k dielectric layer decreases in thickness from a top surface of the first dielectric liner towards a bottom of the first dielectric liner.

18. The device of claim 15, wherein a top surface of the conductive core is recessed from a top surface of the buffer layer.

19. The device of claim 15 further comprising:

a dielectric layer over the semiconductor substrate and the isolation structure; and an additional isolation structure disposed directly over the dielectric layer and the isolation structure, wherein the additional isolation structure comprises an opaque material.

20. The device of claim 15, wherein the first pixel region comprises a first photodiode disposed at a first surface of the semiconductor substrate, and wherein the isolation structure extends from a second surface of the semiconductor substrate into the semiconductor substrate, the second surface being opposite the first surface.

* * * * *